(12) United States Patent
Shen

(10) Patent No.: US 6,972,464 B2
(45) Date of Patent: Dec. 6, 2005

(54) POWER MOSFET

(75) Inventor: Zheng John Shen, Ann Arbor, MI (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 66 days.

(21) Appl. No.: 10/601,121

(22) Filed: Jun. 19, 2003

(65) Prior Publication Data

US 2005/0017299 A1 Jan. 27, 2005

Related U.S. Application Data

(60) Provisional application No. 60/416,942, filed on Oct. 8, 2002.

(51) Int. Cl.[7] .......................... H01L 29/76; H01L 23/48
(52) U.S. Cl. ...................... 257/368; 257/382; 257/342; 257/734; 257/774; 257/779
(58) Field of Search ................................. 257/382, 342, 257/734, 774, 779, 368

(56) References Cited

U.S. PATENT DOCUMENTS 6,683,380 B2 * 1/2004 Efland et al. ............... 257/734
6,710,441 B2 * 3/2004 Eden et al. ................. 257/698

* cited by examiner

*Primary Examiner*—Allan R. Wilson
*Assistant Examiner*—Joseph Nguyen
(74) *Attorney, Agent, or Firm*—Goodwin Procter LLP (57) ABSTRACT

A system of interconnecting regions on an integrated semiconductor device or discrete components. As first connectivity layer has first and second runners to interconnect a plurality of first and second regions. A second connectivity layer has third runners to interconnect the first runners and fourth runners to interconnect the second runners. A third connectivity layer has first pads connected to the third runners and second pads connected to the fourth runners. Solder bumps are used on the first and second pads to connect the pads to other circuits.

8 Claims, 9 Drawing Sheets

POWER MOSFET

CROSS-REFERENCE TO RELATED APPLICATIONS

This application claims the benefit of U.S. Provisional Application No. 60/416,942 filed Oct. 8, 2002 and entitled "Power MOSFET", which is hereby incorporated by reference in its entirety.

BACKGROUND OF THE INVENTION

1. Field of the Invention

The present invention generally relates to the field of semiconductor devices and methods of interconnecting them.

2. Related Background Art

Conventional lateral power metal-oxide semiconductor field effect transistors ("MOSFETs") are currently available. However, these conventional lateral power MOSFETs exhibit problems of high on-state resistance due to the parasitic resistance of metal interconnects. This is typically caused by long and thin interconnects that are used in connecting the transistor cells and in connecting the external leads of the devices. This problem is exacerbated when the die size of the transistor is scaled up and a large number of transistor cells are connected in parallel to handle greater power loads.

Conventional lateral power MOSFETs are also formed using complementary metal-oxide semiconductor ("CMOS") processes. A conventional process may require 18 masks for a 3 metal layer process. The complexity of such a process increases the fabrication costs, errors, and also problems with latch-up.

Bipolar devices are also susceptible to the same problems as MOSFETs with high on-state resistance due to the parasitic resistance of the metal interconnects for similar reasons.

Accordingly, there is a need to provide lateral power devices, such as MOSFETs and bipolar devices, with reduced parasitic resistance of interconnects to reduce on-state resistance. In the case of MOSFETs, there is also a need for fabricating lateral power MOSFETs using fewer processing steps than conventionally used.

BRIEF SUMMARY OF THE INVENTION

The present invention discloses a system for interconnecting regions on a semiconductor substrate using wide metal runners or a planar interconnection layer, and a plurality of solder bumps on conductive pads arranged in a checkerboard pattern or interleaved, thereby reducing parasitic resistance. The interconnections may be used for connecting discrete as well as integrated devices.

BRIEF DESCRIPTION OF THE DRAWINGS

FIGS. 1–6 below depict various aspects and features of the present invention in accordance with the teachings herein.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DESCRIPTION OF THE INVENTION

The preferred embodiment of the present invention uses conventional CMOS fabrication processes to fabricate a semiconductor device embodying the present invention to reduce the costs of production. In accordance with one aspect of the present invention, however, only one type of MOSFETs (either an n-channel or p-channel MOSFET) is made on the die. Since the device of the present invention only consists of parallel n-channel or p-channel transistors, the problem of latch-up is avoided.

In another preferred embodiment no field implants are used, although alternate embodiments may use field implants if there is more than one transistor on a die.

Yet further, in another preferred embodiment of the invention there is no local field oxide layer since the preferred embodiment is constructed having only one device per die.

Yet further, in another preferred embodiment of the invention a self-aligned silicide is formed over the source, drain and gate of the transistor.

One advantage to using the simplified process flows is that in the preferred embodiment, the process masks are reduced from 18 masks for a 3 metal layer process to 10 masks.

Figures 1A, 1B:
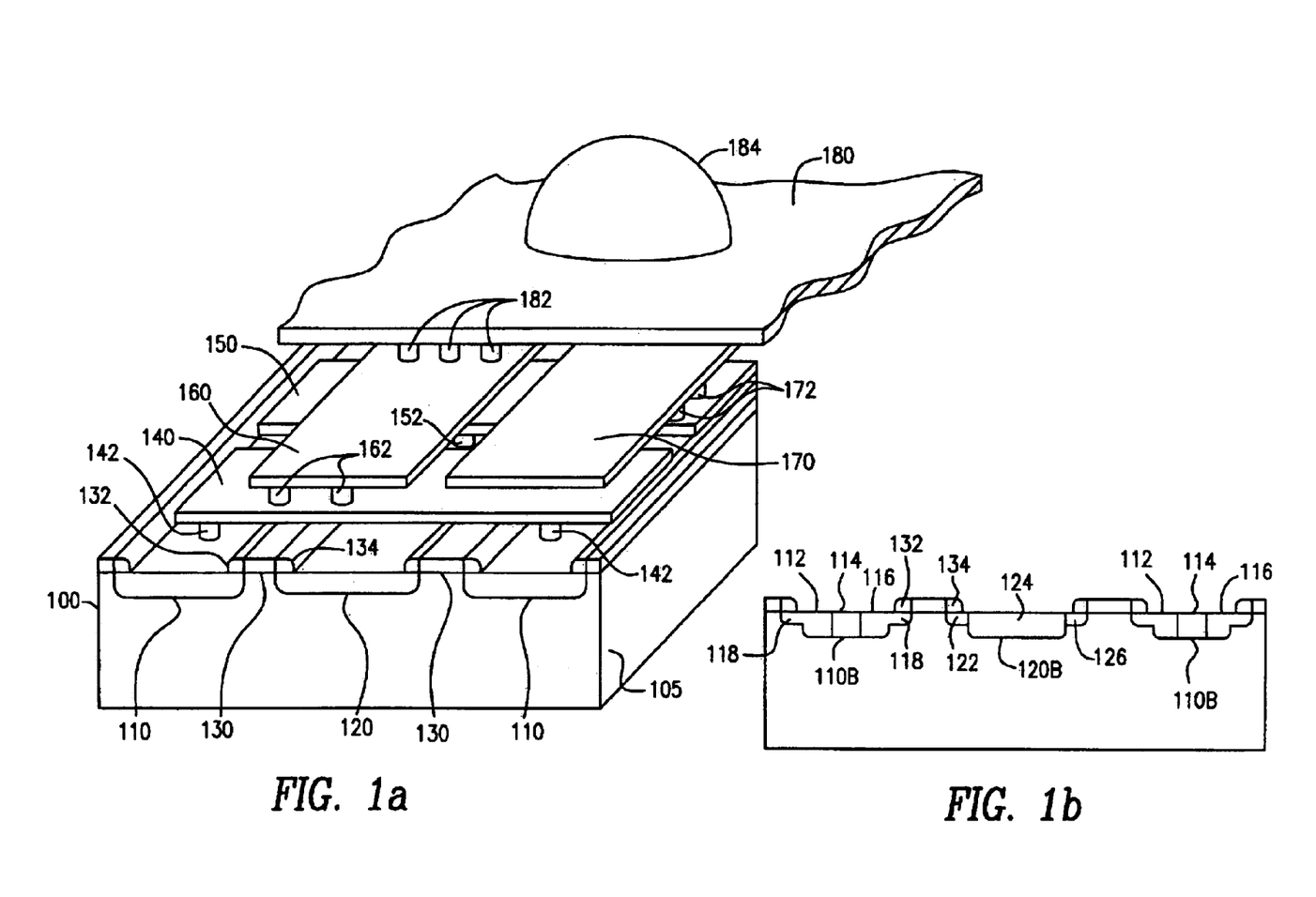

In a preferred embodiment of the present invention the transistor cells are interconnected by runners that are short and wide in comparison to prior art devices. The FIG. 1a shows one embodiment of the present invention in perspective view. In particular, there is shown a portion of a semiconductor device 100 having two sources 110 and a drain 120. In the illustrative example, device 100 is shown with a P substrate 105. In another embodiment, P substrate 105 is deposited on top of a P- substrate (not shown).

Sources 110 and drain 120 are preferably n-type dopant implants into P substrate 105. It will be appreciated that variations of the design of the sources and drains are known to one skilled in the art and within the scope of the present invention. For example, sources 110 and drain 120 could be p-type dopant implants into an N substrate 105.

As another example, FIG. 1b shows a preferred embodiment where sources 110B is comprised of a region 112 which is doped as N+, region 114 which is doped as P+ and region 116 which is doped an N. In an alternate embodiment, source 110B is comprised of region 114 doped as P+, and regions 112 and 116 are N+ implants adjacent to either side of the P+ region 114. In yet another embodiment, regions 112 and 114 also have a region 118. Region 118 may be a lightly doped N– implant while the rest of regions 112 and 114 are N+. Region 118's lightly doped N– implant functions as a lightly doped drain.

In FIG. 1b, drain 120B, in this example, is comprised of region 124 doped as N+ and regions 124 and 126 doped as N. As with the source 110B, it is within the scope of the invention and the skill of one skilled in the art to vary the doping.

Referring back to the embodiment shown in FIG. 1a, gate 130 is comprised of a polysilicon gate over a $SiO_2$ or $Si_3N_4$ insulating layer (not shown) and is placed between source 110 and drain 120. Adjacent to gate 130 are spacers 132 and 134, preferably comprised of $SiO_2$ or $Si_3N_4$, and partially extending over source 110 and drain 120, respectively. (FIG. 1b also shows spacers 132 and 134 extending over regions 118 and 122. Spacers also extend over region 126.)

Source runners 140 and drain runners 150 are formed on a first interconnect layer and is preferably comprised of metal, although other conductive materials may be used. In particular, multiple sources 110 are interconnected by source runner 140 using vias 142. Preferably source runner 140 is in a substantially orthogonal orientation to source 110 and drain 120, although other orientations that are not orthogonal (for instance, angled or even parallel) may be used.

Drains 120 are interconnected by drain runners 150 using vias 152. Preferably, drain runner 150 is in a substantially orthogonal orientation to drain 120, although other orientations that are not orthogonal (for instance, angled or even parallel) may be used.

For the sake of clarity, FIG. 1a shows only one drain 20, but in the preferred embodiment there multiple drains 120 would be interleaved between multiple sources 110. Likewise, only one source runner 140 and drain runner 50 are shown, but in the preferred embodiment there are multiple source and drain runners 140 and 150 and are, preferably, interleaved with each other.

FIG. 1a also shows source runners 160 and drain runners 170 formed on a second interconnect layer and is preferably comprised of metal, although other conductive materials may be used. Source runner 160 interconnects source runners 140 using vias 162. Preferably source runners 160 are in a substantially parallel orientation with respect to source 110, although other orientations that are not parallel (for instance, angled) may be used.

Drain runners 150 are interconnected by drain runners 170 using vias 172. Preferably, drain runner 170 is in a substantially parallel orientation with respect to drain 120, although other orientations that are not parallel (for instance, angled) may be used.

Like the first interconnect layer, only one source and drain runners 160 and 170, respectively, are shown, but in the preferred embodiment multiple source and drain runners 160 and 170 would be used and are, preferably, interleaved with each other.

Although the runners shown in FIG. 1a are substantially of equal widths and rectangular, the runners can be of any shape. For instance, runners may be of unequal widths and runners may have varying narrow and wider portions or rounded corners.

FIG. 1a shows source pad 180 formed on a third interconnect layer, which is preferably comprised of metal, although other conductive materials may be used. Source pad 180 is connected to source runners 160 using vias 182. Also shown is solder bump 184 formed on source pad 180. Although not shown in FIG. 1a for the sake of clarity, similar drain pads (see FIG. 1c, drain pad 190 as an example) and solder bumps connect drain runners 170 via solder bumps and likewise for gate pads and solder bumps. These solder bumps provide connections between the sources 110, drains 120, and gates 130 with external circuits.

In the preferred embodiment the vias (for instance vias 142, 152, 162, 172 and 182) form conductive interconnects and are comprised preferably out of tungsten, although other conductive material may be used. These are formed in a manner that are well-known to those skilled in the art.

Figure 1C:
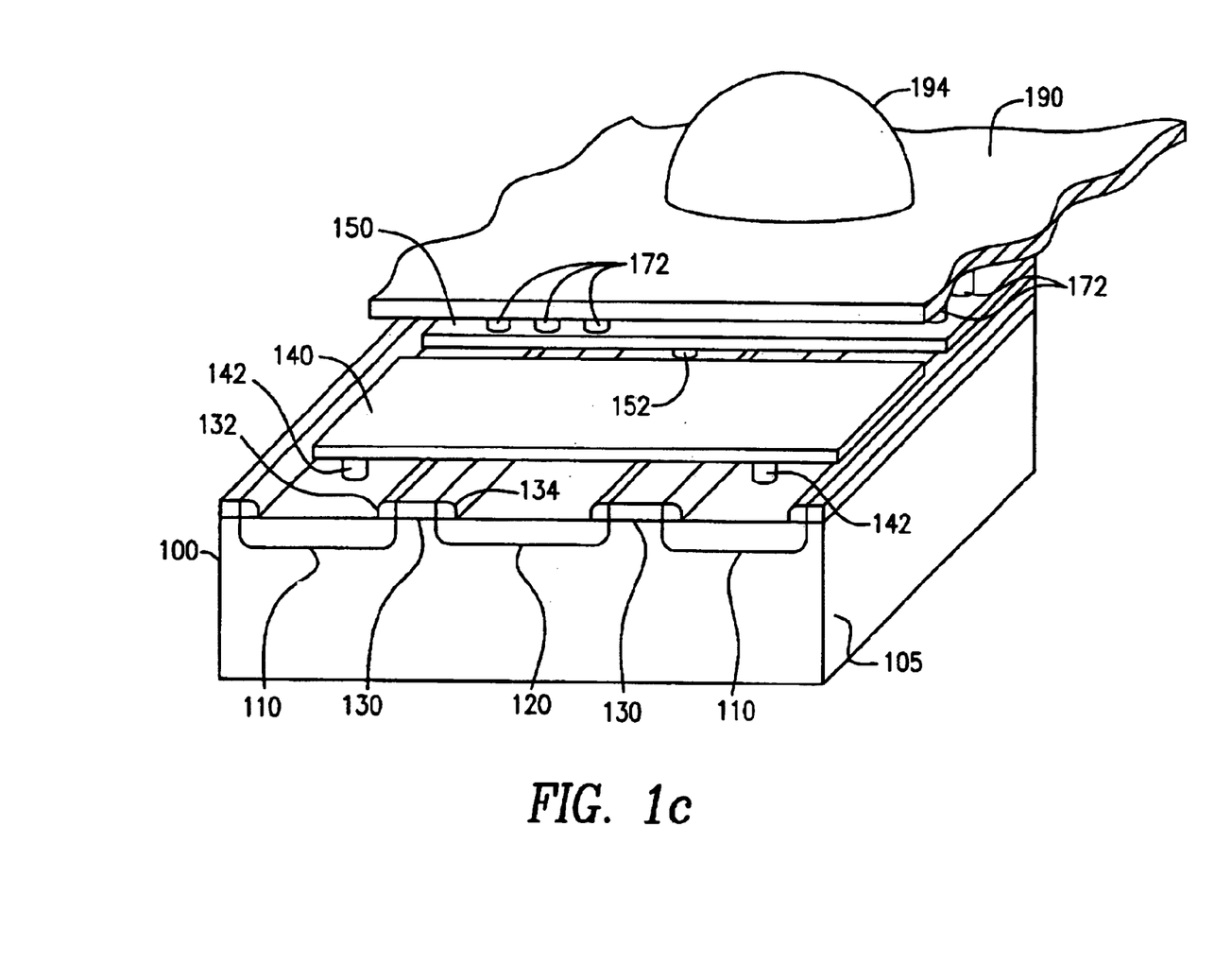

In another embodiment, no second interconnect layer is used for runners. As an example, FIG. 1c shows an embodiment similar to FIG. 1a except there is no second interconnect layer forming source runners 160 and drain runners 170. Instead, drain pad 190 is formed on the second interconnect layer and is connected to drain runners 150 by vias 172. Solder bump 194 is formed on drain pad 190. Although not shown in FIG. 1c for the sake of clarity, similar source pads and solder bumps connect source runners 140.

Figure 2:
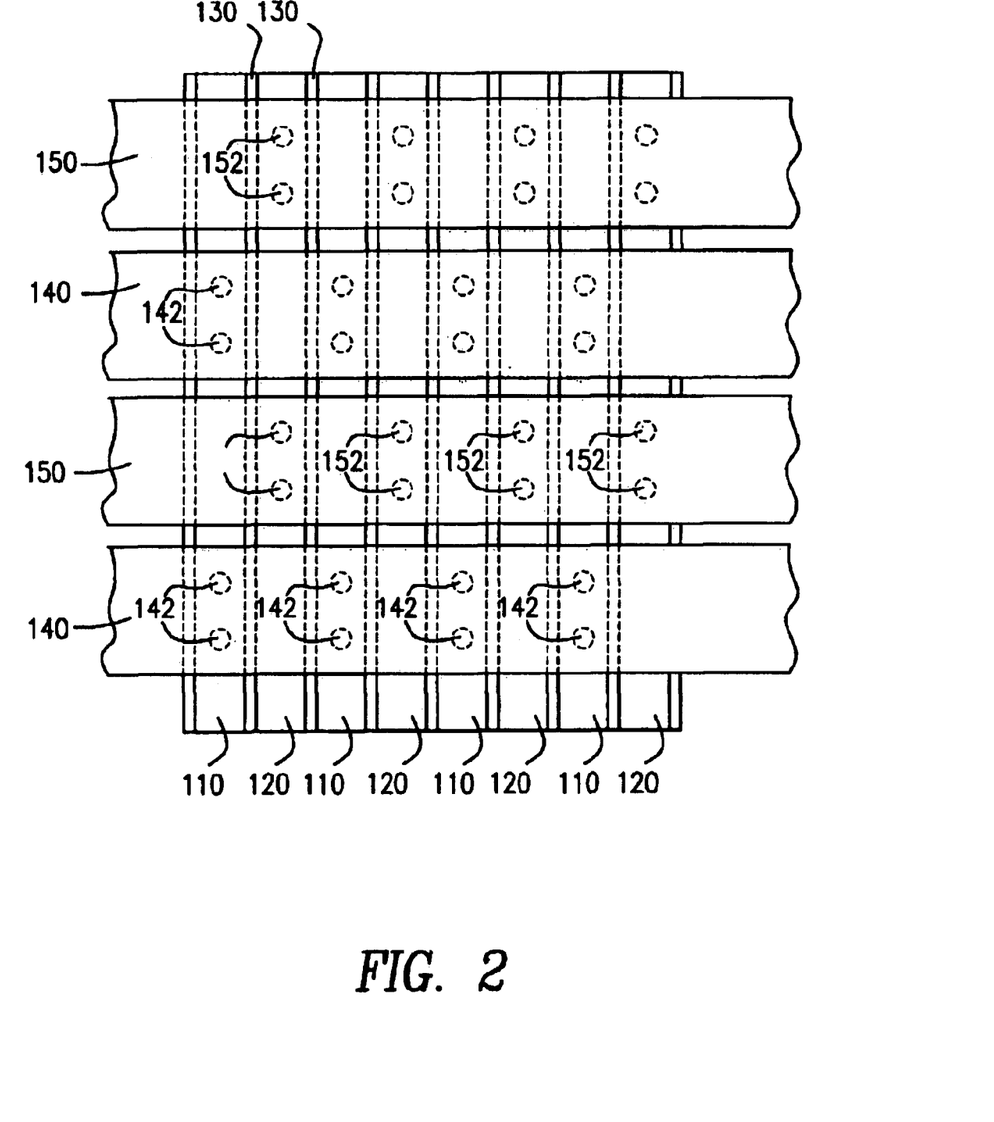

Referring now to FIG. 2 there is shown a top plan view of the embodiment shown in FIG. 1a and showing additional sources 110, drains 120 and first layer interconnect source runners 140 and drain runners 150. Sources 110 and drains 120 are shown having a substantially vertical orientation while source runners 140 and drain runners 150 are shown in a substantially horizontal orientation. Also shown are vias 142 and 152 interconnecting the source runners 140 and drain runners 150 to sources 110 and drains 120, respectively. It should be noted that although FIG. 2, for instance, shows at a point of connection the use of two vias, one via could be used, as shown in FIG. 3a, or more than two, as shown in FIG. 1a for vias 182.

Figure 3A:
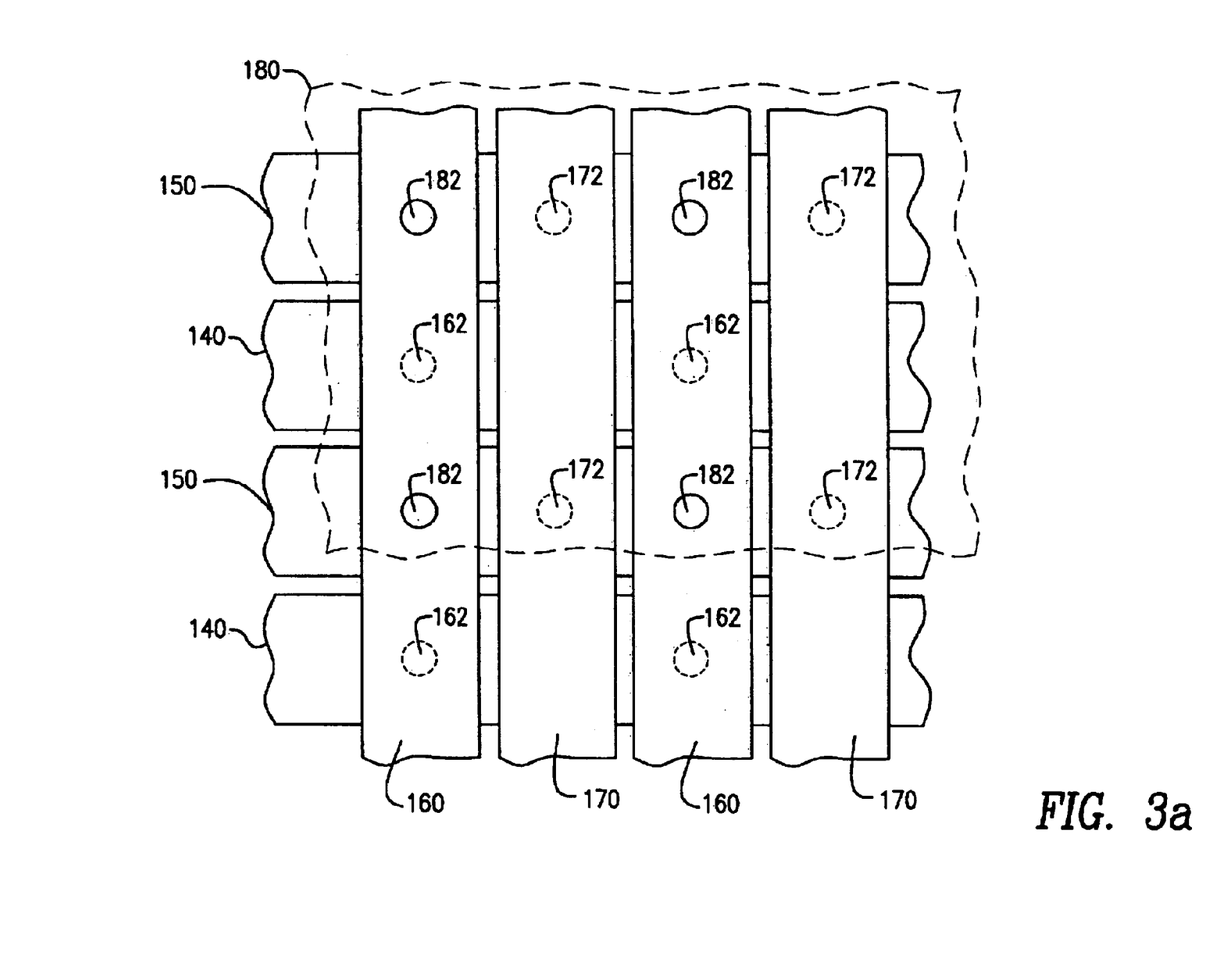

Referring now to FIG. 3a there is shown a top plan view of the embodiment of FIG. 1A showing the first interconnect layer (forming source runners 140 and drain runners 150), second interconnect layer (forming source runners 160 and drain runners 170) and third interconnect layer forming source pad 180 (in outline form).

Source runners 140 and drain runners 150 are laid out in a substantially horizontal orientation. Source runners 160 overlay source runners 140 and are interconnected using vias 162. Drain runners 170 overlay drain runners 150 and are interconnected using vias 172. Source pad 180 is shown in FIG. 3A overlaying source runners 160 and drain runners 170, but is only connected to source runners 160 by vias 182.

Figure 3B:
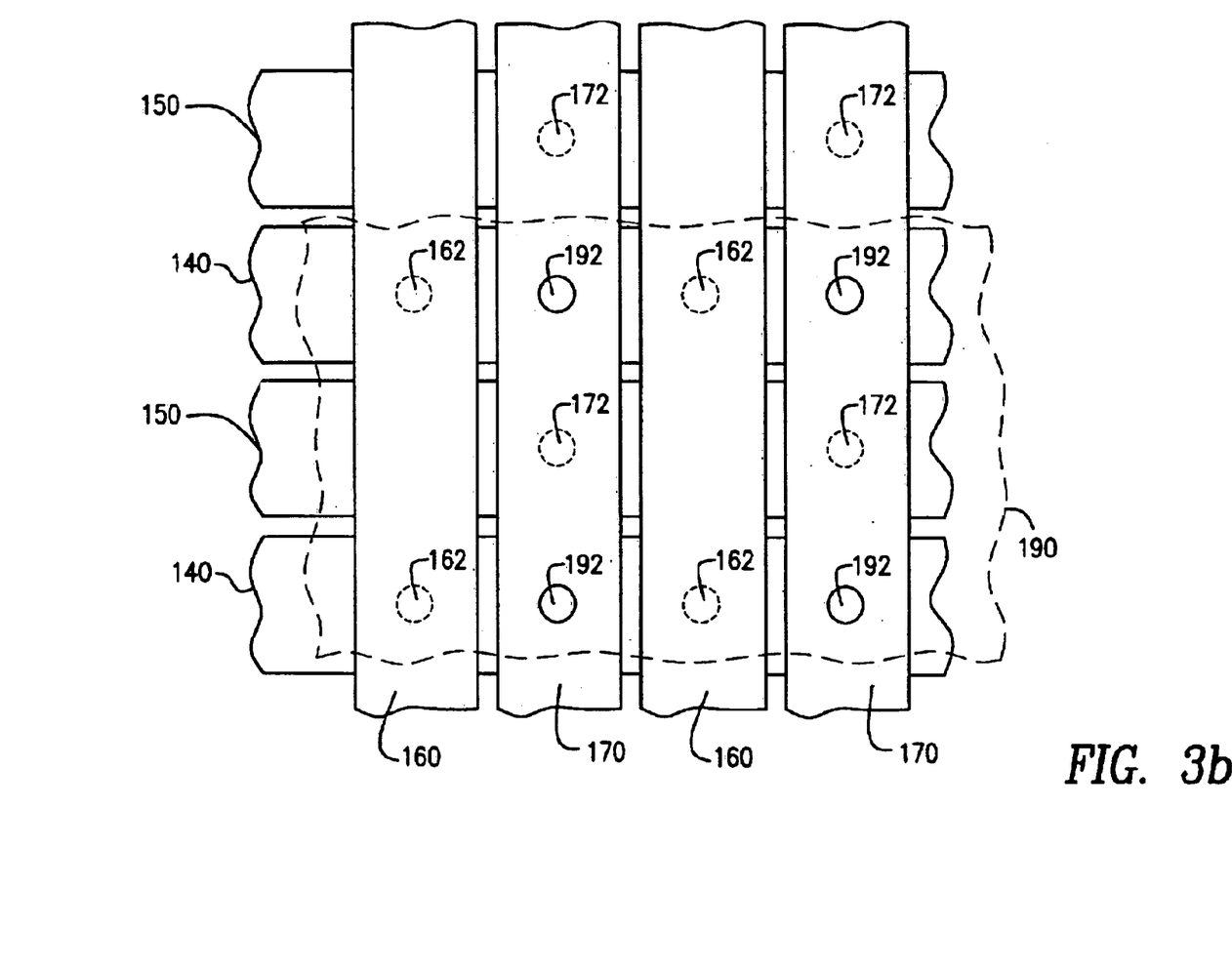

FIG. 3b shows a top plan view of the embodiment of FIG. 1a showing the first interconnect layer (forming source runners 140 and drain runners 150), second interconnect layer (forming source runners 160 and drain runners 170) and a third interconnect layer forming a drain pad 190 (in outline form).

Source runners 140 and drain runners 150 are laid out in a substantially horizontal orientation. Source runners 160 overlay source runners 140 and interconnect source runners 140 using vias 162. Drain runners 170 overlay drain runners 150 and interconnect drain runners 170 using vias 172. Drain pad 190 is shown overlaying source runners 160 and drain runners 170, but is only connected to drain runners 170 by vias 192.

Figure 4A:
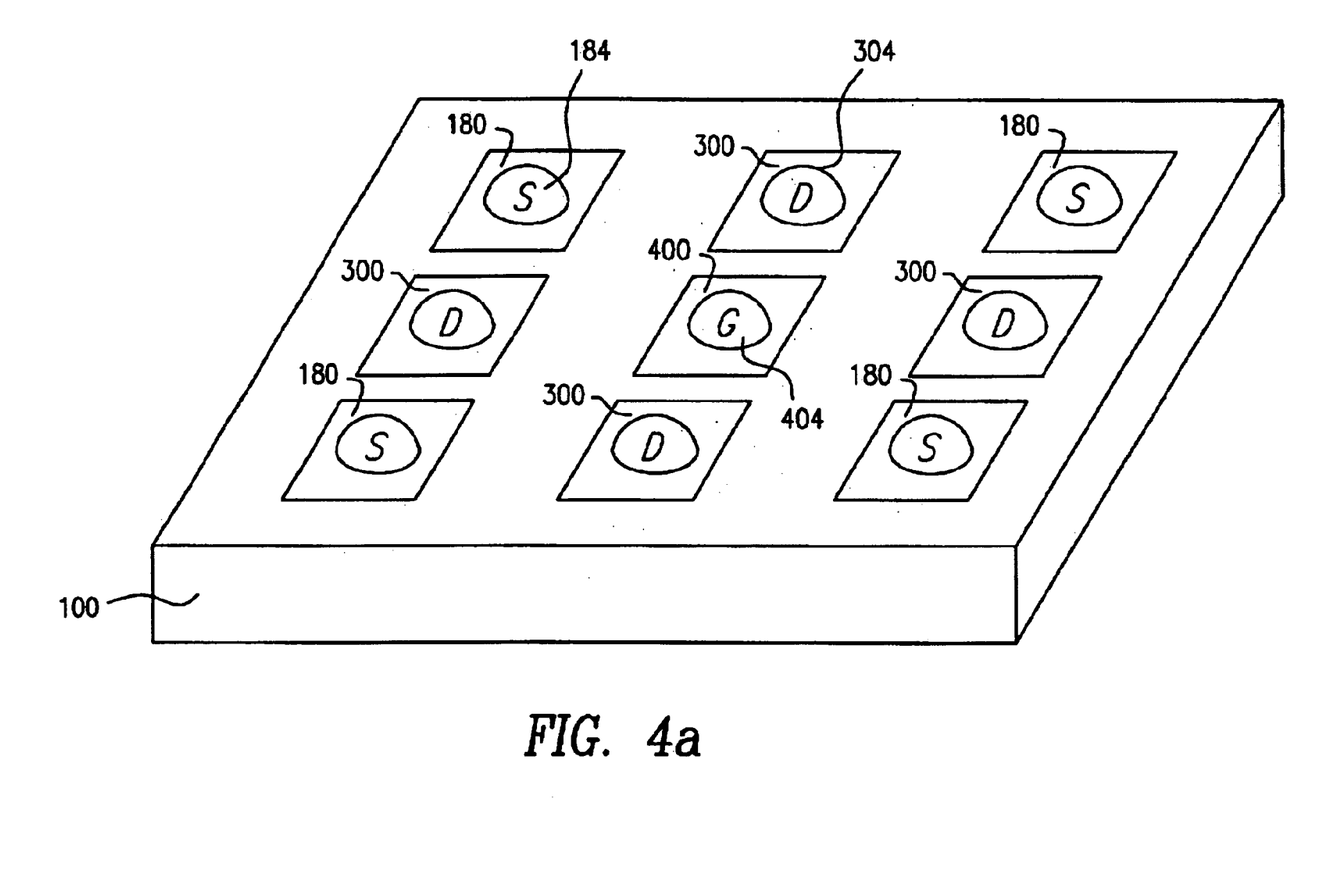

FIG. 4a shows the top of device 100 with source pads 180, analogous drain pads 300 and gate pads 400. Also shown are solder bumps 184 for the source pad, solder bumps 304 for the drain pads, and solder bumps 404 for the gate pads. In the embodiment shown in FIG. 4, the source and drain pads are arranged in a checkerboard layout.

Figure 4B:
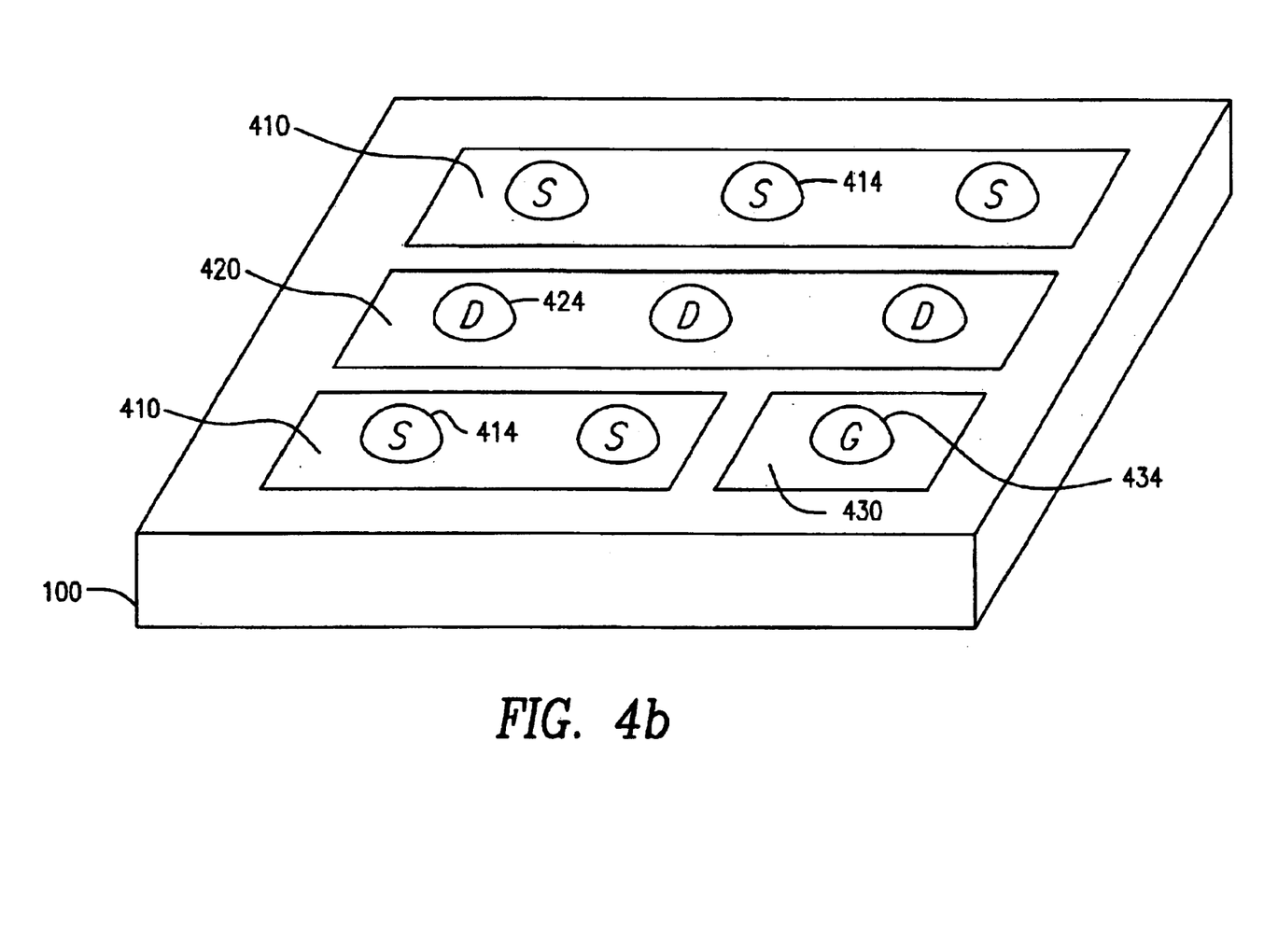

FIG. 4b shows an alternative layout where each source pad 410 and drain pad 420 are shaped as "stripes" and are interleaved with each other. In the preferred embodiment gate pad 430 would be placed with a shortened source pad 410 or shortened drain pad 420 as needed.

Figure 5:
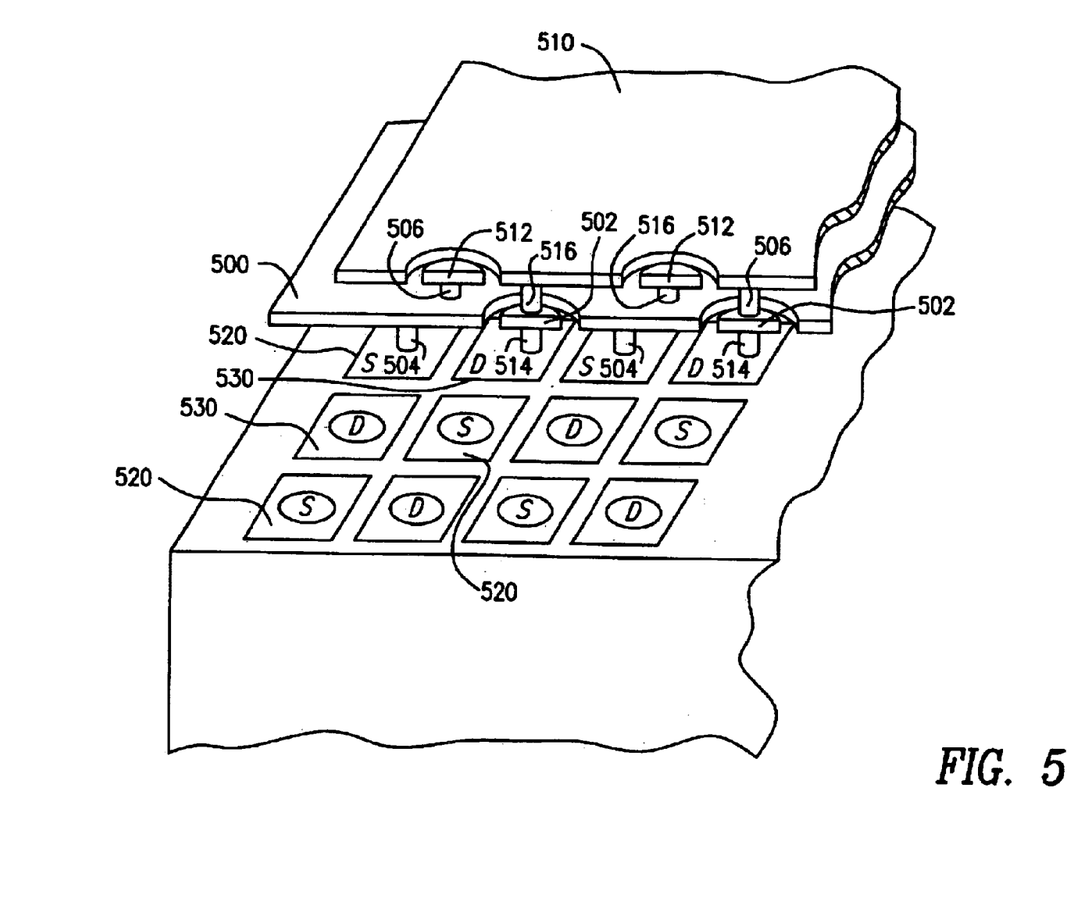

Another embodiment of the present invention is shown in FIG. 5. In this embodiment sources 520 and drains 530 are laid out in a "checkerboard" pattern. A first interconnect layer forms a source connection layer 500 which interconnects sources 520 using vias 504.

A second interconnect layer forms a drain connection layer 510 which connects drains 530 though vias 514, through openings in the first interconnect layer and using a cutout portion of that first layer to form connection 502. Drain connection layer 510 then connects to connection 502 using vias 516.

A third interconnect layer (not shown) would also connect to source connection layer 500 using vias 506, connection 512 and a via connected to connection 512 (not shown). Preferably source connection layer 500, drain connection layer 510 and the third interconnection layer would be comprised of metal or another conductive material and the vias would be comprised of tungsten or other conductive material. This third interconnect layer would be connected to solder bumps in a manner similar to that shown in FIG. 1a.

Figure 6A:
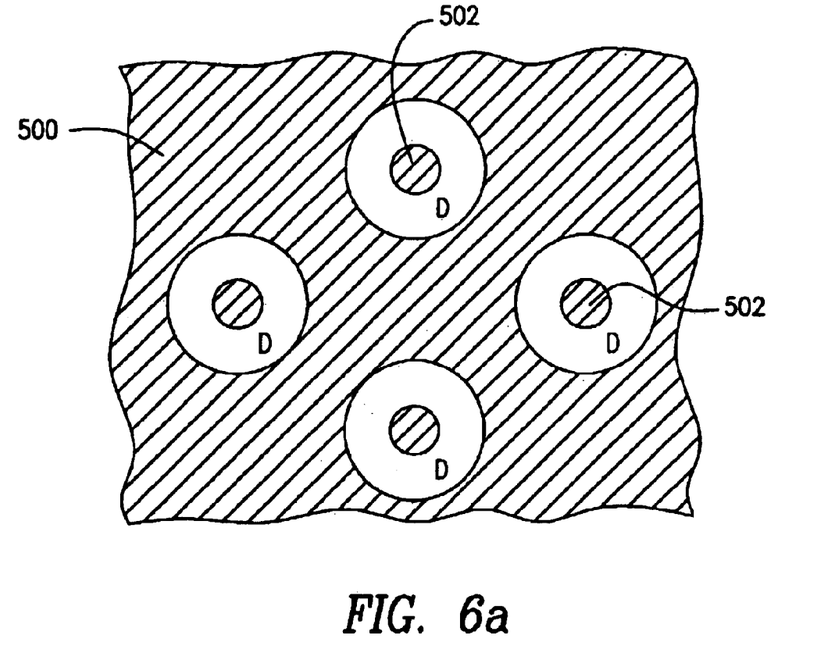
Figure 6B:
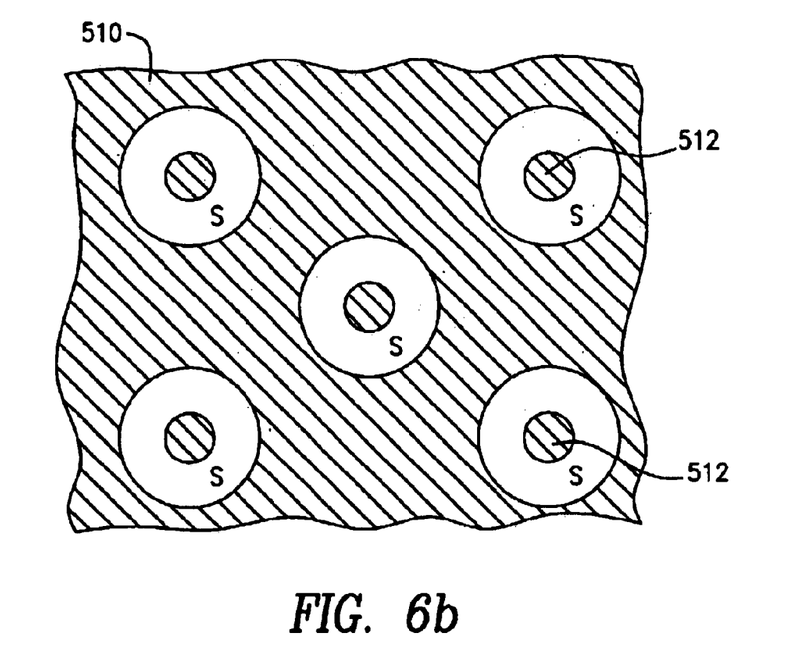

FIGS. 6a and b show a top plan view. In particular, FIG. 6a shows source connection layer 500 with openings and cutouts 502 to permit connections to drains 530 from drain connection layer 510. FIG. 6b shows drain connection layer 510 for the drains with openings and cutouts 512 to permit access and contact to source connection layer 500, which connects to sources 520.

It will be appreciated that the present invention is not limited to integrated devices. Using FIG. 5 as an example of interconnecting discrete components, if sources 520 and drains 530 were discrete components, those components are interconnected using the present invention in a manner described in more detail above with reference to FIG. 5 as an integrated device. Moreover, it is appreciated that more than two or three interconnect layers may be used and that there may be intermediate interconnect layers between, for instance, the first and second interconnect layers or between the second and third interconnect layers.

It should be apparent to those skilled in the art that the foregoing are illustrative only and not limiting, having been presented by way of example only. All the features disclosed in this description may be replaced by alternative features serving the same purpose, and equivalents or similar purpose, unless expressly stated otherwise. Therefore, numerous other embodiments of the modifications thereof are contemplated as falling within the scope of the present invention as defined herein and equivalents thereto.

What is claimed is:

1. A lateral power MOSFET semiconductor device comprising:
   a. a semiconductor substrate;
   b. a plurality of first doped regions in said semiconductor substrate forming a plurality of source elements; said source elements being arranged in one or more rows defined by a layer of silicide,
   c. a plurality of second doped regions in said semiconductor substrate forming a plurality of drain elements; said drain elements being arranged in one or more rows defined by a layer of silicide and interleaved with said plurality of source elements rows;
   d. a first connectivity layer having a plurality of first runners and a plurality of second runners parallel to each other and orthogonal to said rows of source and drain elements, wherein said plurality of first runners are connected to said plurality of source element rows; said plurality of second runners are connected to said plurality of drain element rows; said plurality of first runners being interleaved with said plurality of second runners;
   e. a second connectively layer having a plurality of third runners and a plurality of fourth runners, said third and fourth runners being orthogonal to said first and second runners; wherein said plurality of third runners are multiply connected to said plurality of first runners and said plurality of fourth runners are multiply connected to said plurality of second runners; said plurality of third runners being interleaved with said plurality of fourth runners; and;
   f. a third connectively layer having a plurality of first pads multiply connected to said plurality of third runners and a plurality of second pads multiply connected to said plurality of fourth runners; said first and second pads being arranged in a checkerboard pattern to form said lateral power MOSFET semiconductor device;

wherein there are multiple electrical paths to said source and drain elements such that electrical current will flow to each of said source and drain elements along an electrical path having a minimum of resistance.

2. The lateral power MOSFET semiconductor device as in claim 1 wherein said at least one first pad has at least one first solder bump and said at least one second pad has at least one second solder bump.

3. A lateral power MOSFET semiconductor device comprising:
   a. a semiconductor substrate;
   b. a plurality of first doped regions in said semiconductor substrate forming a plurality of source elements; said source elements being arranged in one or more rows defined by a layer of silicide;
   c. a plurality of second doped regions in said semiconductor substrate forming a plurality of drain elements; said drain elements being arranged in one or more rows defined by a layer of silicide and interleaved with said plurality of source elements rows;
   d. a first connectivity layer having a plurality of first runners and a plurality of second runners parallel to each other and orthogonal to said rows of source and drain elements, wherein said plurality of first runners are connected to said plurality of source element rows; said plurality of second runners arc connected to said plurality of drain element rows; said plurality of first runners being interleaved with said plurality of second runners;
   e. a second connectively layer having a plurality of first pads multiply connected to said plurality of second runners and a plurality of second pads multiply connected to said plurality of third runners; said first and second pads being arranged in a checkerboard pattern to form said lateral power MOSFET semiconductor device;

wherein there are multiple electrical paths to said source and drain elements such that electrical current will flow to each of said source and drain elements along an electrical path having a minimum of resistance.

4. The lateral power MOSFET semiconductor device as in claim 3 wherein said at least one first pad has at least one first solder bump and said at least one second pad has at lean one second solder bump.

5. A lateral power MOSFET semiconductor device comprising:
   a. a semiconductor substrate;
   b. a plurality of first doped regions in said semiconductor substrate forming a plurality of source elements; said source elements being arranged in one or more rows defined by a layer of suicide;
   c. a plurality of second doped regions an said semiconductor substrate forming a plurality of drain elements; said drain elements being arranged in one or more rows defined by a layer of silicide and interleaved with said plurality of source elements rows;
   d. a first connectivity layer having a plurality of first runners and a plurality of second runners parallel to each other and orthogonal to said rows of source and drain elements, wherein said plurality of first runners are connected to said plurality of source element rows; said plurality of second runners are connected to said plurality of drain element rows; said plurality of first runners being interleaved with said plurality of second runners;
   e. a second connectively layer having a plurality of third runners and a plurality of fourth runners, said third and fourth runners being orthogonal to said first and second runners; wherein said plurality of third runners are multiply connected to said plurality of first runners and said plurality of fourth runners are multiply connected to said plurality of second runners; said plurality of third runners being interleaved with said plurality of fourth runners; and;

f. a third connectively layer having a plurality of first pads multiply connected to said plurality of third runners and a plurality of second pads multiply connected to said plurality of fourth runners; said first and second pads being arranged in a striped pattern to form said lateral power MOSFET semiconductor device;

wherein there are multiple electrical paths to said source and drain elements such that electrical current will flow to each of said source and drain elements along an electrical path having a minimum of resistance.

6. The lateral power MOSFET semiconductor device as in claim 5 wherein said at least one first pad has at least one first solder bump and said at least one second pad has at least one second solder bump.

7. A lateral power MOSFET semiconductor device comprising:

a. a semiconductor substrate;

b. a plurality of first doped regions in said semiconductor substrate forming a plurality of source elements; said source elements being arranged in one or more rows defined by a layer of silicide;

c. a plurality of second doped regions in said semiconductor substrate forming a plurality of drain elements; said drain elements being arranged in one or more rows defined by a layer of silicide and interleaved with said plurality of source elements rows;

d. a first connectivity layer having a plurality of first runners and a plurality of second runners parallel to each other and orthogonal to said rows of source and drain elements, wherein said plurality of first runners are connected to said plurality of source element rows; said plurality of second runners are connected to said plurality of drain element rows; said plurality of first runners being interleaved with said plurality of second runners;

e. a second connectively layer having a plurality of first pads multiply connected to said plurality of first runners and a plurality of second pads multiply connected to said plurality of second runners; said first and second pads being arranged in a striped pattern to form said lateral power MOSFET semiconductor device;

wherein there are multiple electrical paths to said source and drain elements such that electrical current will flow to each of said source and drain elements along an electrical path having a minimum of resistance.

8. The lateral power MOSFET semiconductor device as in claim 7 wherein said at least one first pad has at least one first solder bump and said at least one second pad has at least one second solder bump.

* * * * *

UNITED STATES PATENT AND TRADEMARK OFFICE
CERTIFICATE OF CORRECTION

| | |
|---|---|
| PATENT NO. | : 6,972,464 B2 |
| APPLICATION NO. | : 10/601121 |
| DATED | : December 6, 2005 |
| INVENTOR(S) | : Shen |

It is certified that error appears in the above-identified patent and that said Letters Patent is hereby corrected as shown below:

Column 5, Claim 1, line 52, please delete the word "connectively" and replace with -- connectivity --

Column 5, Claim 1, line 62, please delete the word "connectively" and replace with -- connectivity --

Column 6, Claim 3, line 30, please delete the word "connectively" and replace with -- connectivity --

Column 6, Claim 5, line 51, please delete the word "suicide" and replace with -- silicide --

Column 6, Claim 5, line 52, please delete the word "an" and replace with -- in --

Column 6, Claim 5, line 66, please delete the word "connectively" and replace with -- connectivity --

Column 7, Claim 5, line 8, please delete the word "connectively" and replace with -- connectivity --

Column 8, Claim 7, line 13, please delete the word "connectively" and replace with -- connectivity --

Signed and Sealed this
Tenth Day of May, 2011

David J. Kappos
*Director of the United States Patent and Trademark Office*